US00RE41890E

(19) United States
(12) Reissued Patent
Sato

(10) Patent Number: US RE41,890 E
(45) Date of Reissued Patent: Oct. 26, 2010

(54) METHODS FOR GROWING SEMICONDUCTORS AND DEVICES THEREOF FROM THE ALLOY SEMICONDUCTOR GAINNAS

(75) Inventor: Shunichi Sato, Miyagi-Ken (JP)

(73) Assignee: Ricoh Company, Ltd., Tokyo (JP)

(21) Appl. No.: 10/603,418

(22) Filed: Jun. 24, 2003

Related U.S. Patent Documents

Reissue of:
(64) Patent No.: 5,904,549
Issued: May 18, 1999
Appl. No.: 08/834,959
Filed: Apr. 7, 1997

U.S. Applications:
(

(63) Continuation of application No. 09/860,369, filed on May 17, 2001.

(30) Foreign Application Priority Data

Apr. 11, 1996 (JP) ..... 08114177

(51) Int. Cl.
*H01L 21/30* (2006.01)

(52) U.S. Cl. ..... 438/478; 438/46
(58) Field of Classification Search ..... 438/478, 438/45–47
See application file for complete search history.

(56) References Cited

U.S. PATENT DOCUMENTS 5,904,549 A * 5/1999 Sato ..... 438/478

FOREIGN PATENT DOCUMENTS

| | | |
|---|---|---|
| JP | 7-154023 | 6/1995 |
| JP | 7-240373 | 9/1995 |
| JP | 8-222764 | 8/1996 |

OTHER PUBLICATIONS

Alloy Semiconductor Physics and Electronics Symposium, pp. 337–340 N. Ohkouchi, et al. (Jul. 1993) "MOVPE Growth of $GaAs_{1-x}N_x$ Alloys", Twelfth Record of.

Ohkouchi et al., Proceedings of 12$^{th}$ Symposium on Alloy Semiconductor Physics and Electronics, 1993, pp. 337–340.

M. Kondow et al., "GaInNaas: a novel material for long–wavelength semiconductor lasers", IEEE Journal of Selected Topics in Quantum Electronics, vol. 3, No. 3, pp. 719–730, Jun. 1997.

* cited by examiner

*Primary Examiner*—Laura M Menz
(74) *Attorney, Agent, or Firm*—Cooper & Dunham LLP

(57) ABSTRACT

A method is disclosed for growing a nitrogen-containing III-V alloy semiconductor on a semiconductor substrate such as GaAs, which is formed by MOCVD method using nitrogen containing organic compounds having relatively low dissociation temperatures. The alloy semiconductor has a high nitrogen content which exceeds the contents previously achieved, and has a high photoluminescence intensity.

There are also disclosed fabrications of semiconductor devices comprising the alloy semiconductors, such as heterostructure and homo-junction light emitting devices.

10 Claims, 7 Drawing Sheets

METHODS FOR GROWING SEMICONDUCTORS AND DEVICES THEREOF FROM THE ALLOY SEMICONDUCTOR GAINNAS

Matter enclosed in heavy brackets [ ] appears in the original patent but forms no part of this reissue specification; matter printed in italics indicates the additions made by reissue.

*CROSS-REFERENCE TO RELATED APPLICATION*

*This reissue application, filed Jun. 24, 2003, is a continuation of co-pending reissue application Ser. No. 09/860,369. This application and reissue application Ser. No. 09/860,369 each seeks reissue of U.S. Pat. No. 5,904,549, issued May 18, 1999 based on U.S. application Ser. No. 08/834,959, filed Apr. 7, 1997.*

BACKGROUND

1. Field of the Invention

This invention relates in general to semiconductors and semiconductor devices and more particularly, to methods for growing nitrogen-containing alloy semiconductors and semiconductor devices such as semiconductor lasers and light emitting diodes comprising the alloy semiconductors.

2. Description of the Related Art

Compound semiconductors in general and nitrogen-containing III-V alloy semiconductors in particular have recently received considerable attention as a group of new semiconductor materials.

As an example of methods for growing a III-V alloy semiconductor, there has been disclosed an epitaxial growth of a nitrogen-containing III-V alloy semiconductor on a silicon substrate (Japanese Laid-Open Patent Application H6-334168). In the disclosure, a nitrogen-containing alloy semiconductor is epitaxially grown without dislocations by the lattice misfit, thereby leading to feasibility of fabricating III-V compound semiconductor devices on silicon.

There are also disclosed nitrogen-containing alloy semiconductors such as GaInNAs, AlGaNAs, and GaNAs, which can be lattice matched to substrates such as GaAs, InP, and GaP (Japanese Laid-Open Patent Application H6-037355). Although it has been previously considered that no known III-V alloy semiconductor is grown, which had a smaller bandgap energy than that of GaAs and lattice matched to GaAs, recent results of the alloy semiconductor growths indicate that the above-mentioned GaInNAs alloy semiconductor, for example, can be grown as a material lattice matched to the GaAs substrate.

Since the GaInNAs compound semiconductor has a smaller bandgap energy than that of GaAs, above growth results of GaInNAs alloy semiconductor may lead to the feasibility of light emitting devices, of which wavelength of the light emission is in the range of about 1.5 micron, longer than that from GaAs. As aforementioned, that has been previously conceived not feasible by the devices fabricated on GaAs substrates.

In the growth of the above-mentioned nitrogen-containing III-V alloy semiconductors, a group V element such as arsenic, for example, is desorbed from the surface of a substrate with ease even at relatively low temperatures. Therefore, the alloy semiconductors are preferably grown at temperatures as low as possible.

As a source material for nitrogen, $NH_3$ has been used conventionally. However, the use of $NH_3$ is not completely satisfactory, since temperatures for alloy semiconductor growth have to be relatively high because of a relatively high dissociation temperature of $NH_3$ and an unduly desorption of arsenic results at such temperatures. Therefore, $NH_3$ is not preferred as a source material for the growth of alloy semiconductors which simultaneously contain both nitrogen and arsenic.

Accordingly, in place of the use of $NH_3$ as is in conventional growths, active species which are generated by a high frequency plasma excitation of nitrogen, have been used as the source material for nitrogen. These species are used for a growth of nitrogen-containing III-V alloy semiconductors by, for example, molecular beam epitaxy (MBE) which is carried out under very low pressures, or low pressure metalorganic chemical vapor deposition (MOCVD) which is performed at pressures of about 0.1 Torr(13.3 Pa).

As another source material for nitrogen, an organic material such as dimethylhydrazine (DMHy) has been reported for a growth of a GaNAs alloy semiconductor by conventional MOCVD at a reduced pressure of 60 Torr (as described by N. Ohkouchi and others, Proceedings of 12th Symposium on Alloy Semiconductor Physics and Electronics, 1993, pages 337–340)

As aforementioned, nitrogen is desorbed from crystal surfaces with relative ease during the growth. This causes difficulties in obtaining nitrogen-containing III-V alloy semiconductors with a large concentration of nitrogen. In conventional growths of the alloy semiconductors, therefore, previous attention is primarily directed to an increase of the nitrogen content during the crystal growth.

In the above-mentioned method using activated nitrogen species, a partial pressure of nitrogen during the growth had to be relatively low to avoid deactivation of the nitrogen species previously activated. Therefore, for the growth of nitrogen-containing alloy semiconductor such as GaNAs, for example, the low partial pressure of nitrogen necessarily leads to low pressures of another group V element such as arsenic. This results in an undesirable increase in concentrations of arsenic vacancies and makes it difficult to grow nitrogen-containing III-V alloy semiconductor of satisfying quality.

For example, in order to obtain the nitrogen content of about 1%, a crystal growth is carried out under the conditions such as a reactor pressure of 25 Pa, $N_2$ flow rate of 50 sccm, and $AsH_3$ flow rate of 10 sccm (as described by M. Sato, Proceedings of 13th Symposium on Alloy Semiconductor Physics and Electronics, 1994, pages 101–101). Although the reactor pressure is once increased to 300 Pa to initiate the plasma discharge in the reactor, a plasma activation of nitrogen is subsequently carried out at 25 Pa, as indicated above. Under the conditions, a partial pressure of $AsH_3$ of as low as approximately 0.9 Pa results. In addition, other gaseous materials such as triethylgallium (TEG) as a source material for group III element and $H_2$ as a carrier gas, have to be additionally supplied into the reactor. As a result, the partial pressure of $AsH_3$ further decreases.

In order to further increase the nitrogen content, it is necessary either to reduce the reactor pressure, increasing the amount of nitrogen source materials, or decreasing the flow rate of $AsH_3$. The partial pressure of $AsH_3$ further decreases.

As exemplified as above, previous growth attempts to increase the nitrogen content had led to an increase in the concentration of arsenic(group V element) vacancies, and this gives rise to, in turn, metal (group III element)-rich alloy semiconductors. As a result, these methods are not able to provide nitrogen-containing alloy semiconductors of excellent quality.

As another example of the nitrogen source material, (he aforementioned dimethylhydrazine (DMHy) is also used for a growth of a GaNAs alloy semiconductor by conventional low pressure MOCVD operated at a pressure of 60 Torr, resulting in the nitrogen content of about 0.5% or less. This GaNAs growth has been carried out also under conditions of an increased flow rate of DMHy and a decreased flow rate of $AsH_3$. Because of a decreased $AsH_3$ partial pressure, a metal-rich alloy semiconductor is obtained similarly to the above example and even under the condition of an increased nitrogen flow rate, it is difficult to increase the nitrogen content and this method also is not be able to provide nitrogen-containing alloy semiconductors of excellent quality.

SUMMARY OF THE INVENTION

It is therefore an object of the present invention to provide methods which overcome the above-noted difficulties.

Another object of the invention is to provide methods for growing III-V alloy semiconductors having a high nitrogen concentration and to provide semiconductor devices comprising the alloy semiconductors.

According to an aspect of the present invention, there is provided a method for growing an alloy semiconductor on a semiconductor substrate, having at least one layer of III-V alloy semiconductor comprised of a plurality of group V elements including at least nitrogen and arsenic simultaneously. The method comprises a step of growing the alloy semiconductor by MOCVD, for example, using source materials such as nitrogen-containing organic compounds for nitrogen, and $AsH_3$ for arsenic, under conditions of a partial pressure of $AsH_3$ in a reactor equal to or more than 2 Pa, and a temperature of a semiconductor substrate of more than or equal to 550° C., whereby providing III-V alloy semiconductors of a high nitrogen concentration, which has excellent quality for the use for light emitting devices, of which wavelength of light emission is in a range longer than that from GaAs devices.

According to yet another aspect of the invention, there is provided a method for growing nitrogen-containing III-V alloy semiconductors, using nitrogen-containing organic compounds as source materials for nitrogen, such as dimethylhydrazine (DMHy) and tertiary butyl amine (TBA), which have improved properties such as low dissociation temperatures and high vapor pressures, thereby leading to growths of alloy semiconductors of excellent quality for the use of light emitting devices.

According to another aspect of the invention, there is provided a method for growing nitrogen-containing III-V alloy semiconductors on a semiconductor substrate, and controlling conductive properties of, and carrier concentrations in the alloy semiconductors by adding appropriate dopants such as selenium for n-type, and group II element such as zinc or magnesium for p-type.

By the use of organic materials which contain nitrogen and have a relatively low dissociation temperatures, as the source materials for nitrogen, nitrogen-containing III-V alloy semiconductors can be grown. The alloy semiconductors have a high nitrogen content which exceeds the contents previously achieved by conventional methods, and have excellent crystalline quality and a high photoluminescence efficiency, indicative of promising characteristics for light emitting devices, as well as photodetecting devices.

BRIEF DESCRIPTION OF THE DRAWINGS

Preferred embodiments of the invention are described hereinbelow with references to the drawings wherein.

DESCRIPTION OF THE ILLUSTRATIVE EMBODIMENTS

Figure 1:
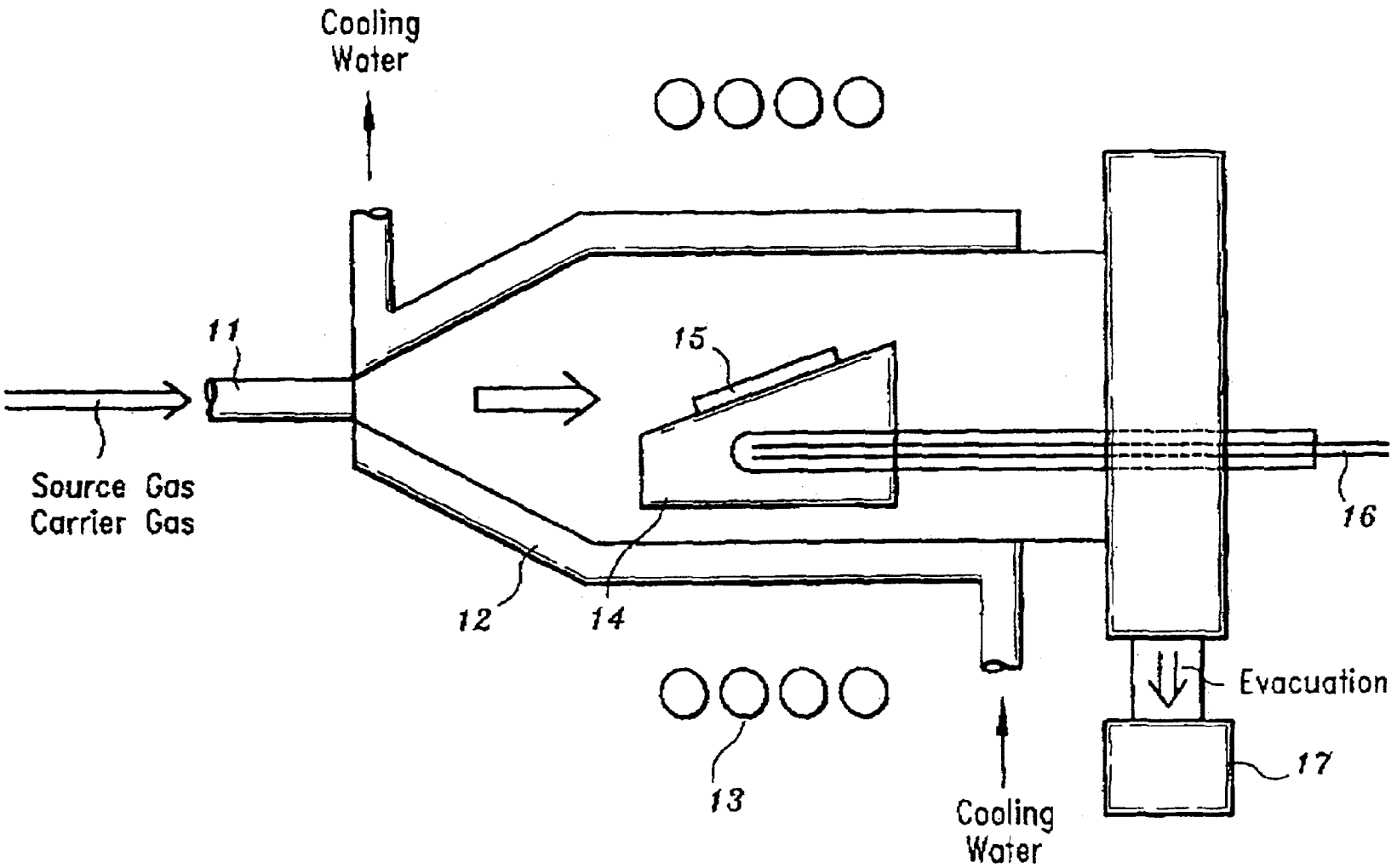
FIG. 1 is a schematic drawing of an MOCVD apparatus for growing alloy semiconductors in accordance with the present invention.

In the description which follows, specific embodiments of the invention particularly useful in alloy semiconductor growths and light emitting device applications are described. It is understood, however, that the invention is not limited to these embodiments. For example, it is appreciated that the methods for the alloy semiconductor growth and light emitting device fabrication of the present invention are adaptable to any form of semiconductor growths and device fabrications. Other embodiments will be apparent to those skilled in the art upon reading the following description.

Referring to the drawings, the invention will be described.

FIG. 1 represents a section view of a reactor of an MOCVD apparatus used for growing alloy semiconductors in accordance with the present invention. Although a horizontal apparatus is shown in this figure, a vertical apparatus may also be used.

As illustrated in FIG. 1, the reactor comprises a quartz tube 12 which is operable as a reactor, equipped with a water cooling system around the outer face of the tube, an inlet 11 for feeding gaseous components such as source materials and carrier gas, a substrate 15 placed on a carbon susceptor 14, a heating coil 13 supplied with high frequency power to heat the carbon susceptor 14 with the substrate 15, a thermocouple 16 to measure temperatures of the carbon susceptor 14 and the substrate 15, and an evacuation system 17 to evacuate to and/or maintain an appropriate low pressures. By the use of this apparatus and MOCVD method, growth of alloy semiconductors are carried out.

In the present invention, there is provided a method for growing layers of alloy semiconductors on a semiconductor substrate, having at least one layer of III-V alloy semiconductors comprised of a plurality of group V elements including at least nitrogen and arsenic simultaneously. The method comprises the step of growing the alloy semiconductors by MOCVD, using source materials such as nitrogen-containing organic compounds for nitrogen and $AsH_3$ for arsenic, under conditions of a partial pressure of $AsH_3$ in a reactor equal to or more than 2 Pa, and a temperature of a semiconductor substrate of more than or equal to 550° C.

According to another aspect of the present invention, there is provided a method comprising the step of growing nitrogen-containing III-V alloy semiconductors by MOCVD, using source materials such as nitrogen containing organic compounds under conditions of a partial pressure of $AsH_3$ in a reactor equal to or more than 10 Pa, and a temperature of a semiconductor substrate of more than or equal to 600° C.

Although $NH_3$ is conventionally used as a source material for nitrogen, as aforementioned, the dissociation efficiency of $NH_3$ is relatively low. At temperatures high enough to achieve the nitrogen dissociation, nitrogen as well as other group v element such as arsenic are desorbed from a surface of the semiconductors with relative ease. Therefore, low temperatures are preferred for the growth of layers of nitrogen-containing alloy semiconductors such as GaInNAs. Since these low temperatures are not favorable to the use of $NH_3$, other nitrogen containing compounds of lower dissociation temperatures are preferred as source materials.

Accordingly, in the present invention, nitrogen containing organic compounds are used such as dimethylhydrazine (DMHy) and tertiary butyl amine (TBA), for example, which have relatively high vapor pressures, thereby leading to lower flow rates of carrier gas such as $H_2$ used for bubbling and transporting nitrogen source materials. As a result, a fluctuation in transport rates by, for example, temperature change of cylinders of nitrogen source materials, can be reduced and III-V alloy semiconductors can be grown with excellent quality and reproducibility.

Also by the methods of this invention, GaInNAs layers can be grown on a GaAs substrate. By adding indium to GaAs in this layer growth, the lattice constant of the alloy semiconductor increases with decreasing a bandgap energy. By adding nitrogen, by contrast, the lattice constant decreases with decreasing bandgap energy. Accordingly, by adding appropriate amount of nitrogen to $Ga_{1-x}In_xAs$, the lattice constant of resultant alloy semiconductor layers can be matched to that of GaAs, with a decreased band gap energy. It becomes easier, therefore, to grow satisfactory GaInNAs layers which is able to have light emissions at room temperature, of which wavelengths are longer than that from GaAs (approximately 870 nm at room temperature)

The GaInNAs layers can thus be grown with more ease by the method of the present invention, these layers are an improvement over $Ga_{1-x}In_xAs$ layers which are conventionally used for light emitting devices and have a lattice mismatch. By the use of the present GaInNAs layers, it becomes easier to obtain alloy layers having excellent quality and being capable of emitting light with wavelengths of 1.1 μm and above, longer than those by the previous layers.

Also in the layer formation of the present invention, conductive properties and carrier concentrations of the nitrogen-containing III-V alloy semiconductors layers may be controlled by adding appropriate dopants, selenium for n-type, and group II element such as zinc or manganese for p-type, as will be detailed below.

The III-V mixed compound semiconductors grown as mentioned above can be used for fabricating light emitting devices such as light emitting diodes and semiconductor lasers, and photodetecting devices such as photodiodes, having excellent device characteristics.

The following examples are provided further to illustrate preferred embodiments of the invention.

EXAMPLES

Example 1

Layers of a GaInNAs alloy semiconductor of the present invention were grown on a GaAs substrate in accordance with steps which follow.

As source materials for group III element, trimethylgallium (TMG), triethylgallium (TEG), trimethylindium (TMI), or triethylindium (TEI) was used. Also used as source materials were $AsH_3$ for arsenic, and dimethylhydrazine (DMHy), monomethylhydrazine (MMHy), or tertiary butyl amine (TBA) for nitrogen.

As illustrated in FIG. 1, gaseous components from these materials were introduced to a water-cooled quartz reactor 12 through a gas inlet 11. Prior to the introduction of the gaseous species, the reactor was evacuated to a pressure of $1.3\times10^4$ Pa. A carbon susceptor 14 was heated to an appropriate temperatures by a heating coil 13 fed with high frequency power and a GaAs substrate 15 was subsequently heated by the heat transfer from the susceptor 14. Source materials were dissociated by heating and resultant gaseous species from the source materials were transported to the GaAs substrate 15 to grow alloy layers by surface reactions on the substrate.

The feeding rates of each source material were from $4.0\times10^{-6}$ to $4.0\times10^5$ mol/min for TMG, from $4.4\times10^{-7}$ to $4.4\times10^{-6}$ mol/min for TMI, from $6.0\times10^{-5}$ mol/min (0.4 sccm) to $2.2\times10^{-3}$ mol/min (46.4 sccm) for $AsH_3$, and from $5.0\times10^{-4}$ to $3.0\times10^{-2}$ mol/min for DMHy. The flow rate of total gaseous species from the source materials together with a carrier gas $H_2$ was typically 6 l/min. In addition, an $AsH_3$ partial pressure was from 0.9 to 102 Pa at a temperature for the layer growth ranging from 450° C. to 700° C.

As an example, an alloy semiconductor growth was carried out under conditions such as gas feeding rates of about $2.0\times10^{-5}$ mol/min for TMG, about $2.2\times10^{-6}$ mol/min for TMI, about $3.3\times10^{-4}$ mol/min (7 sccm) for $AsH_3$, about $6.4\times10^{-3}$ mol/min for DMHy, and an $AsH_3$ partial pressure of 15.4 Pa. In this example, the $AsH_3$ partial pressure was higher than the conventional growth condition.

In addition, a feeding rate of DMHy was one order of magnitude higher than that of $AsH_3$ and a growth temperature was about 630° C. The resulting speed of the layer growth was 1.7 μm/hour.

Figure 2:
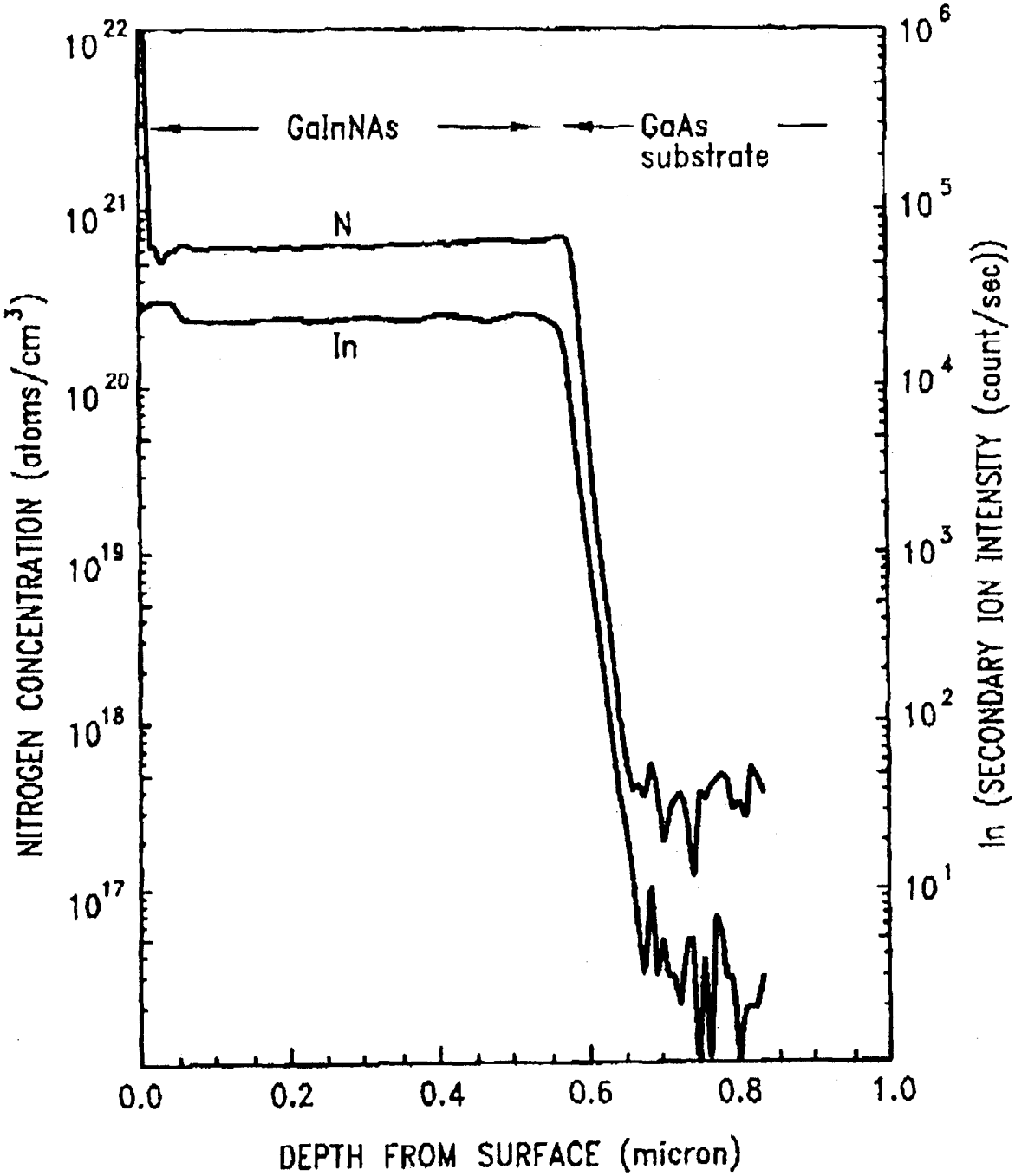
FIG. 2 shows results of secondary ion mass spectroscopy (SIMS) on depth profile of nitrogen in GaInNAs layers in accordance with the invention.

FIG. 2 represents results of secondary ion mass spectroscopy (SIMS) on the depth profile of nitrogen in GaInNAs layers presently obtained.

From the results, a concentration of nitrogen was deduced to be about $6.5\times10^{20}$ atoms/cm$^3$, which corresponds to the content of 3%. From the above-mentioned SIMS results together with the lattice constant obtained from x-ray diffraction measurements using Cu $K_\alpha$lines ($K_{\alpha1}$ 0.15405 nm and $K_{\alpha2}$ 0.1544 nm), the indium content was obtained as about 6%, thereby resulting in a composition $Ga_{0.94}In_{0.06}N_{0.03}As_{0.97}$ for the alloy layers. The presently obtained lattice constant of GaInNAs layers was smaller than that of GaAs.

In addition, photoluminescence (PL) spectra from the layers were observed at room temperature with an argon laser excitation and a germanium photodiode as a detector and a peak wavelength of the spectra was obtained at 1.2 μm.

Figure 3:
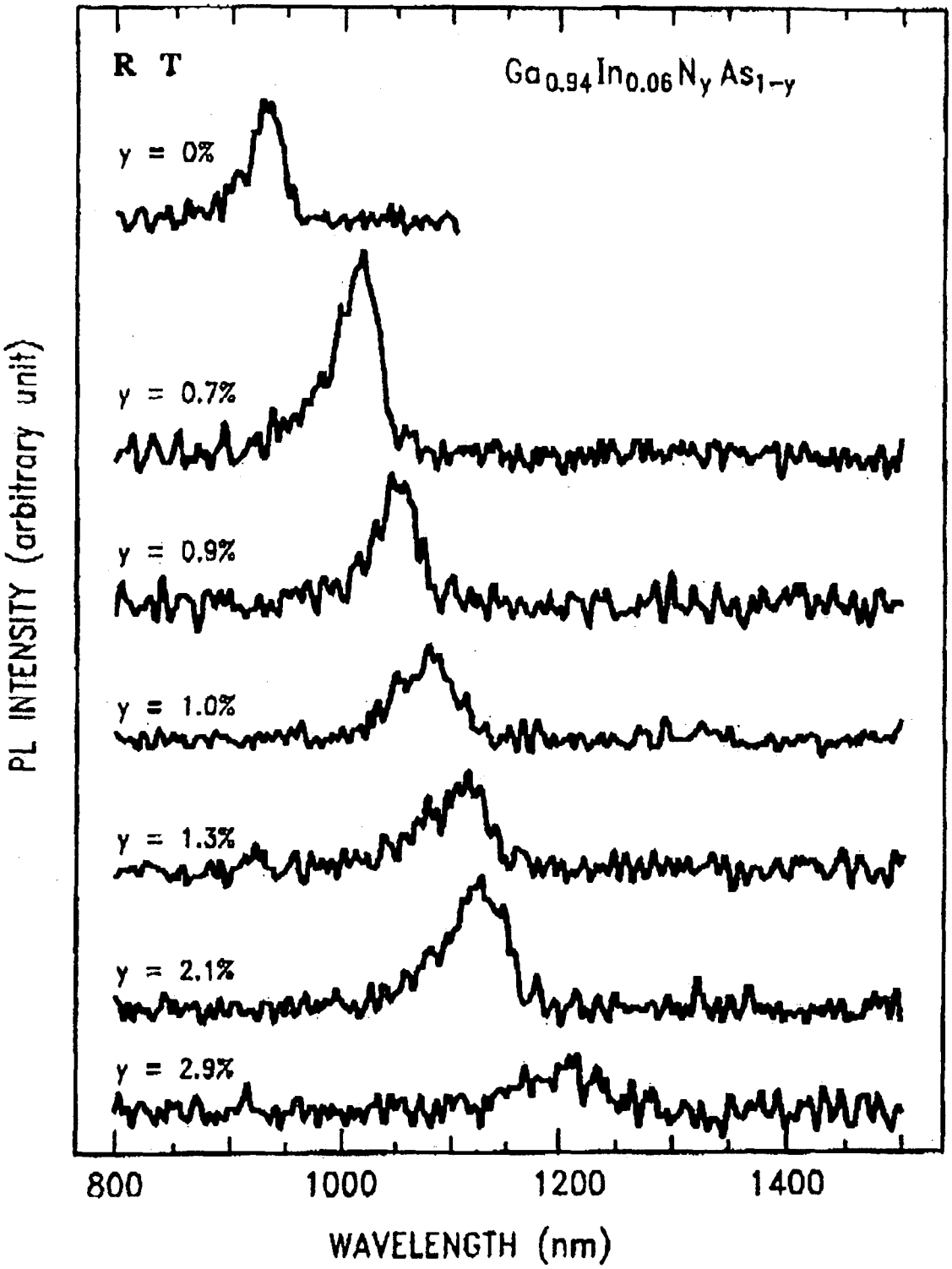
FIG. 3 shows room temperature photoluminescence spectra of a plurality of GaInNAs layers in accordance with the invention.

Various GaInNAs alloy layers having the indium content of about 6%, were grown under $AsH_3$ partial pressures of equal to or more than 4.8 Pa. FIG. 3 shows room temperature photoluminescence spectra from these layers, indicating that peak wavelengths of the spectra increase with increasing the nitrogen content in the layers. For alloy layers having the nitrogen content of 2.1%, in which the layers are lattice-matched to GaAs, the peak wavelength was about 1.15 μm.

There was also found in the present alloy growths, the nitrogen content increased with decreasing growth temperature at a constant gas feeding rate. In addition, if both of a feeding rate of a nitrogen source material and a growth temperature remained constant, the nitrogen content increased with decreasing an $AsH_3$ partial pressure. Furthermore, in order to obtain the same nitrogen content under a constant $AsH_3$ partial pressure, a feeding rate of the DMHy nitrogen source material, had to be increased with increasing growth temperature.

Figure 4:
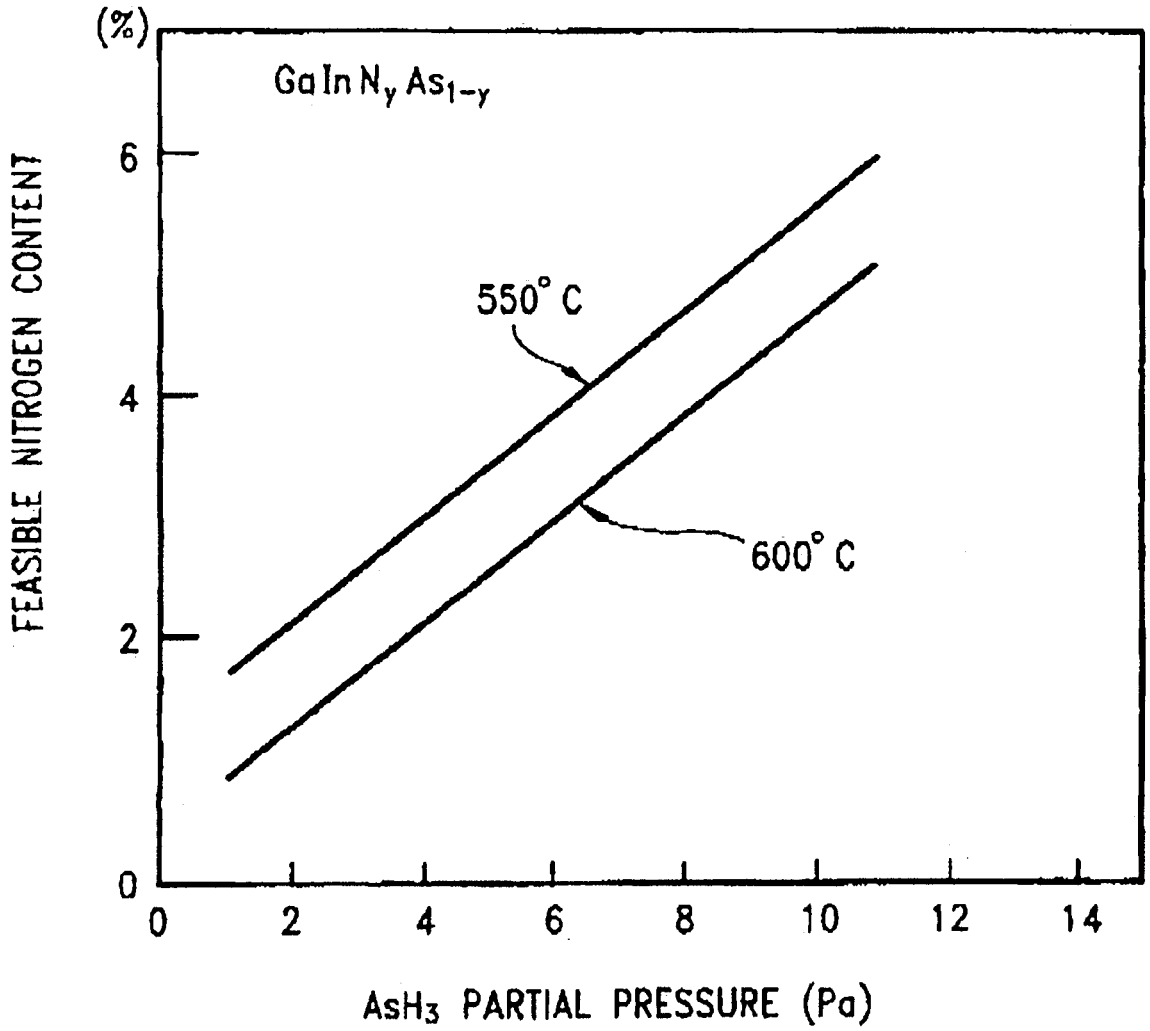
FIG. 4 contains a graph which shows a relationship between the nitrogen content in the alloy semiconductor $Ga_{0.87}\ In_{0.13}\ N_y\ As_{1-y}$ and growth conditions.

In addition, at such relatively high temperatures as 600° C. or above, $GaInN_y As_{1-y}$ layers having a high nitrogen content was able to grow without becoming rich in metal (group III) species. FIG. 4 represents a relationship between the nitrogen content and growth conditions, of feasible $Ga_{0.87} In_{0.13} N_y As_{1-y}$ layers.

As illustrated in FIG. 4, although maximum nitrogen content in the alloys grown at 600° C. under 2 Pa $AsH_3$ partial pressure was approximately 1%, the nitrogen content of 4.6% was obtained at 10 Pa $AsH_3$ partial pressure. Also, even under a $AsH_3$ partial pressure as low as 2 Pa or less, the desorption of both arsenic and nitrogen was suppressed for the growth at low temperatures such as, for example, between about 450° C. and about 550° C. This results in a high nitrogen content.

For the above-mentioned growth at low temperatures, however, photoluminescence that was observed was considerably weak. Since the light emitting capability of alloy layers manifest itself in the photoluminescence intensity, growth temperatures such as 550° C. and above, are therefore deduced as preferred temperatures for the growth of alloy layers for the light emitting devices.

Furthermore, the photoluminescence intensity becomes approximately unchanged at temperatures of 600° C. and above. It was also observed that, for the layers grown under constant conditions of the growth temperature and the composition of feeding source materials with the exception of changing $AsH_3$ partial pressure, the photoluminescence intensity increased with increasing the $AsH_3$ partial pressure, indicative of excellent quality of alloy layers for light emitting devices.

Figure 5:
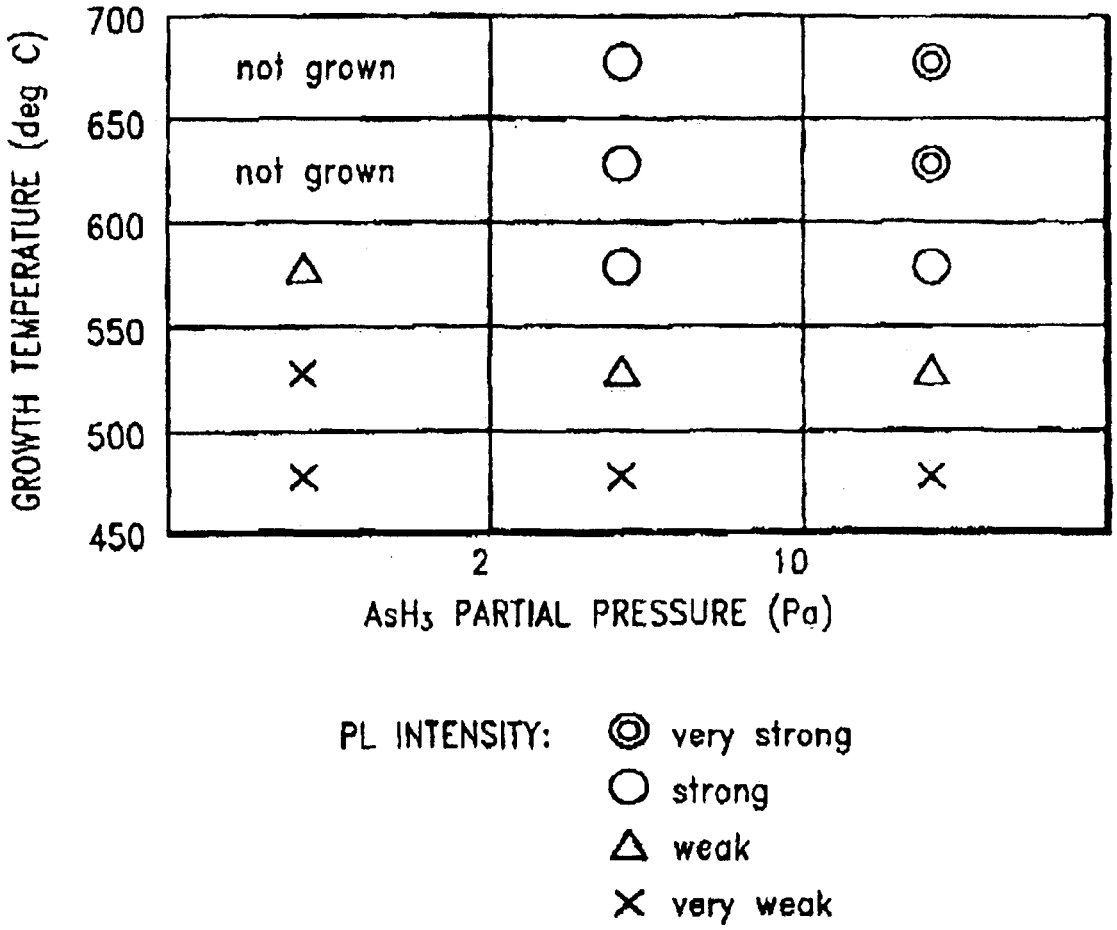
FIG. 5 contains Table 1 which shows a relationship between photoluminescence intensities and $AsH_3$ partial pressures, of $Ga_{0.94}\ In_{0.06}\ N_{0.002}\ As_{0.98}$ layers in accordance with the invention.

FIG. 5 contains a table which illustrates the relationship between photoluminescence intensity of $Ga_{0.94} In_{0.06} N_{0.02} As_{0.98}$ layers, growth temperatures, and $AsH_3$ partial pressures. It is shown in the table that, although lower temperatures are advantageous for achieving higher nitrogen contents, photoluminescence intensity decreases at these low temperatures. The results indicates that too low temperatures such as above-mentioned are not preferred for alloy layers to acquire excellent light emitting capability.

As above-mentioned, it is shown that, under $AsH_3$ partial pressures as low as 2 Pa or less, $GaInN_y As_{1-y}$ layers are not grown, which have the nitrogen content of 2% or greater and exhibit an excellent photoluminescence characteristics. This is considered due to an accelerated desorption of arsenic and resultant metal-rich alloys. In order to obtain satisfactory growth results under the same conditions, temperatures such as 550° C. or lower are necessary.

By contrast, at temperatures of lower than 550° C. with a decreased $AsH_3$ flow rate and an increased nitrogen flow rate, GaInNAs layers having a high nitrogen content tend to be formed, resulting in layers of rather insufficient quality caused by too low $AsH_3$ partial pressures.

Therefore, under conditions such as a $AsH_3$ partial pressure of 2 Pa or greater and at a temperature of 550° C. or higher, alloy layers can be grown, which have the nitrogen content of about 2%, a high photoluminescence intensity and a high crystallinity.

With a nitrogen concentration of 2%, GaInNAs layers with the indium content of about 6% can be lattice-matched to GaAs substrates. This nitrogen content of 2% is satisfactory for fabricating semiconductor lasers for light signal amplifiers, of wavelengths in the range of about 980 nm.

It has also shown that, if $AsH_3$ partial pressures were increased to 10 Pa or higher, Ga $InN_y As_{1-y}$ alloy layers were able to grow, even at high temperatures such as 600° C. or above, which had the nitrogen content of 4% or greater and a high photoluminescence intensity. With the nitrogen content of 4.6%, GaInNAs layers having the indium content of about 13%, can be lattice-matched to GaAs. This leads to the feasibility of semiconductor lasers, of which wavelength is 1.3 μm or longer to be used for communication, for example.

Figure 6:
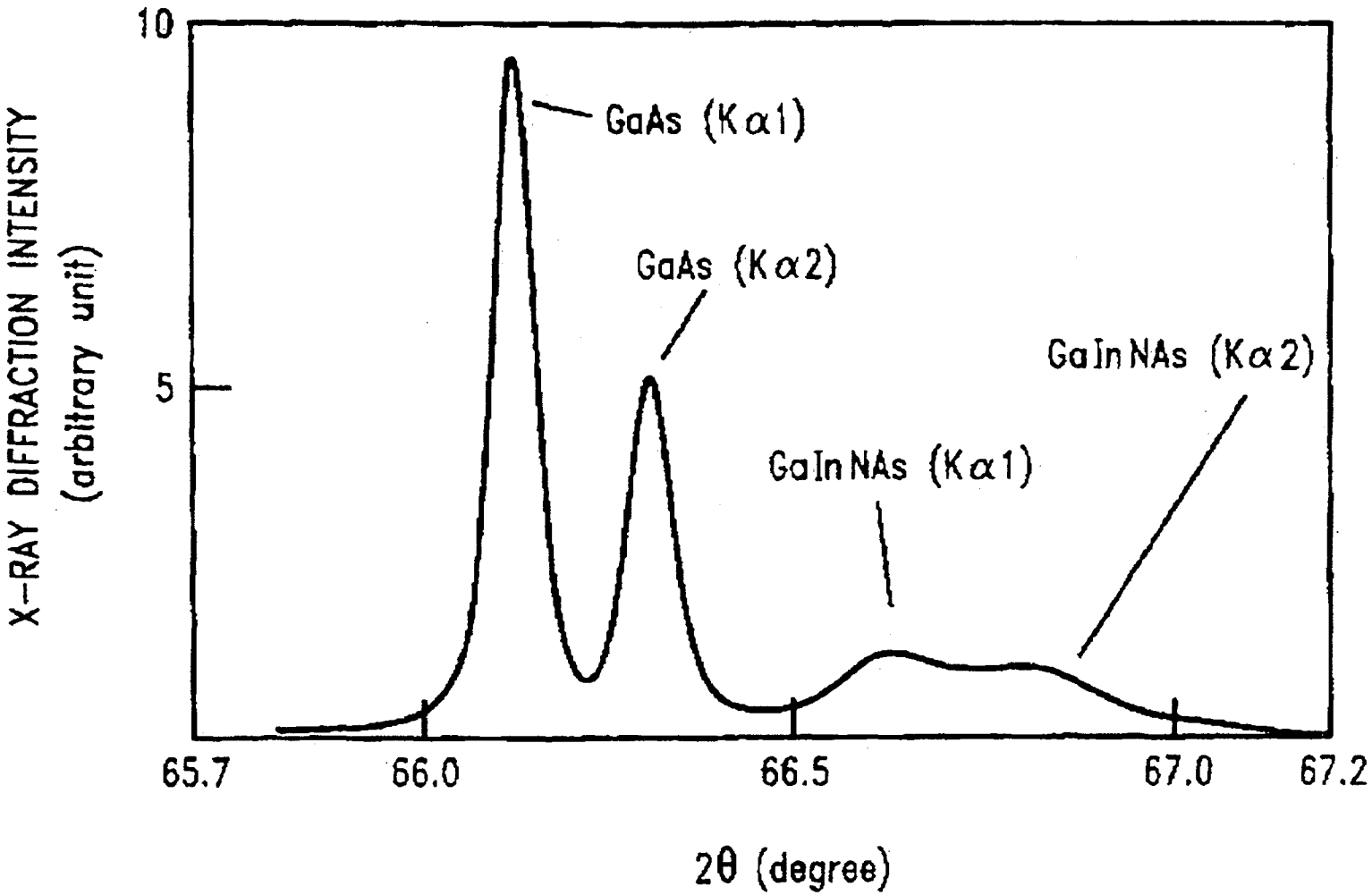
FIG. 6 is an x-ray diffraction pattern of $Ga_{0.92}\ In_{0.08}\ N_y\ As_{1-y}$ layers in accordance with the invention, from which the nitrogen content of 4.6% is deduced.

$Ga_{0.92} In_{0.08}$ NAs layers having a layer thickness of 0.5 pm were analyzed by x-ray diffraction method. The results of the x-ray analysis are shown FIG. 6 and indicates that the layers have a lattice constant smaller than that of GaAs.

In addition, a Nomarski microscope observation of the layers shows that, since the thickness was less than the critical thickness, no cross-hatching pattern on the surface induced by the lattice relaxation was observed and that the layers were as flat as the surface of GaAs substrate.

As detailed above, by the use of organic materials as the source materials for nitrogen, which contain nitrogen and have a relatively low dissociation temperatures, and also by carrying out the alloy layer growth under $AsH_3$ partial pressures of as high as at least 2 Pa, there was able to grow nitrogen-containing III-V alloy semiconductors in the present invention.

The alloy layers have the nitrogen content of equal to or more than 0.5%, thereby exceeding the nitrogen content previously achieved by conventional methods which utilize organic nitrogen containing compounds as source materials. Moreover, since the growth was carried out at relatively high temperatures of 550° C. or higher, alloy layers presently grown have excellent crystalline quality and a high photoluminescence efficiency. In addition, under $AsH_3$ partial pressures of 10 Pa or more and at temperatures of 600° C. or higher, alloy layers can be grown with the nitrogen content of 4% or greater.

With regard to the lattice-match, GaInNAs layers do not have to be completely lattice-matched and may be in the strained-lattice structure as long as the layers are within the critical thickness. Also in the embodiment, although growth methods of nitrogen-containing III-V alloy semiconductors have been described primarily on GaInNAs alloy layers, these methods are not limited to the above examples but also applicable for semiconductor alloys such as, for example, GaNAs, AlNAs, AlInNAs, AlGaNAs, AlGaInNAs, and GaInNPAs.

Example 2

Figure 7:
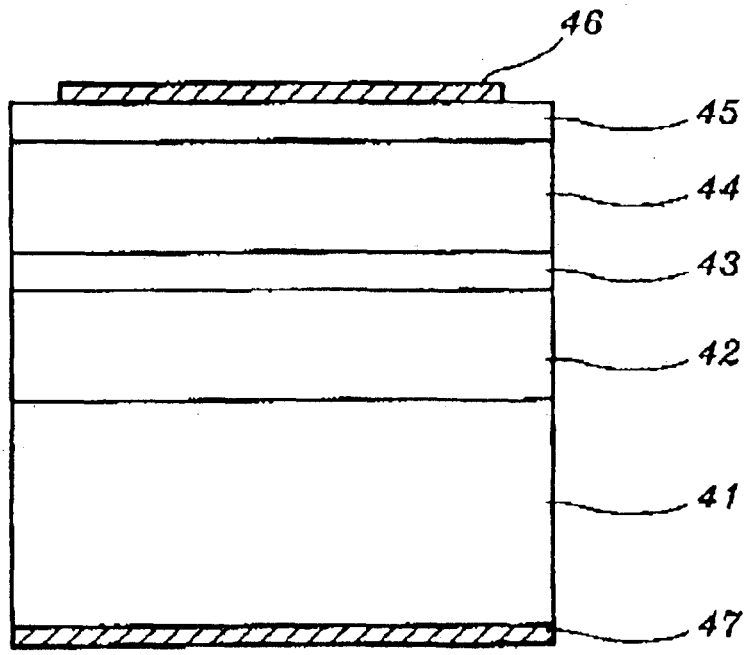
FIG. 7 is a section view of a light emitting device in accordance with a second embodiment of the invention.

A light emitting device was fabricated using GaInNAs alloy layers for light emitting layers. FIG. 7 represents a sectional view of the device of the present embodiment.

The light emitting device comprises on an n-type (or n-) GaAs substrate 41, an n-$Al_{0.4} Ga_{0.6}$ As cladding layer 42, a GaInNAs active layer 43, a p-$Al_{0.4} Ga_{0.6}$ As cladding layer 44, and a p-GaAs contact layer 45, each formed by MOCVD method from the bottom in the order stated. Additionally provided for the device were a positive electrode 46 on the p-GaAs contact electrode 45 and a negative electrode 47 on the rear side of the n-GaAs substrate 41, whereby constituting a light emitting device of the broad stripe type construction.

The GaInNAs active layers were grown so as to be lattice-matched to GaAs lattice under the same conditions as those adopted in embodiment 1. As aforementioned, the GaInNAs layers do not have to be completely lattice-matched and may be in the strained lattice structure as long as the layer is within the critical thickness. Also in the present growth, an AsH, partial pressure was 25 Pa, which was higher than that for conventional growths. Under the conditions, GaInNAs active layers were grown with fewer group V vacancies than those conventionally grown and a higher photoluminescence efficiency.

In addition, since a bandgap energy for the GaInNAs is small enough compared with that of GaAs, a strong carrier confinement into the GaInNAs active layer results, thereby constituting a light emitting device which has an improved temperature characteristics and a higher light power output compared with GaInAsP devices which are conventionally used in the relatively long wavelength range.

Although, an $Al_{0.4}$ $Ga_{0.6}$ As layer was used as a cladding layer in the present embodiment, an $Al_x$ $Ga_{1-x}$ As ($0 \leqq x \leqq 1$) layer, having different compositions can also be used. Also in the embodiment, although the structure of the layer was described as a rather simple double hetero (DH) structure, other structures such as, for example, a quantum well structure may also be used. Various device structures other than the above-mentioned broad-stripe type may also be adopted. Furthermore, although a GaInNAs layer was described as a active layer, GaInNAs alloys comprised of either aluminum or phosphorus may also be used as long as nitrogen and arsenic are simultaneously included in the alloy.

Also in this embodiment, the device has better temperature characteristics than that of GaInPAs which is conventionally used for the relatively long wavelength region, and also has a higher light power output, as aforementioned. As a result, fabrications of laser devices benign to human eyes, become feasible, which are used for the telecommunication, ranging, and free-space communication. These lasers can be economically operated without auxiliary circuits for automatic power and/or temperature control, for example.

Example 3

Figure 8:
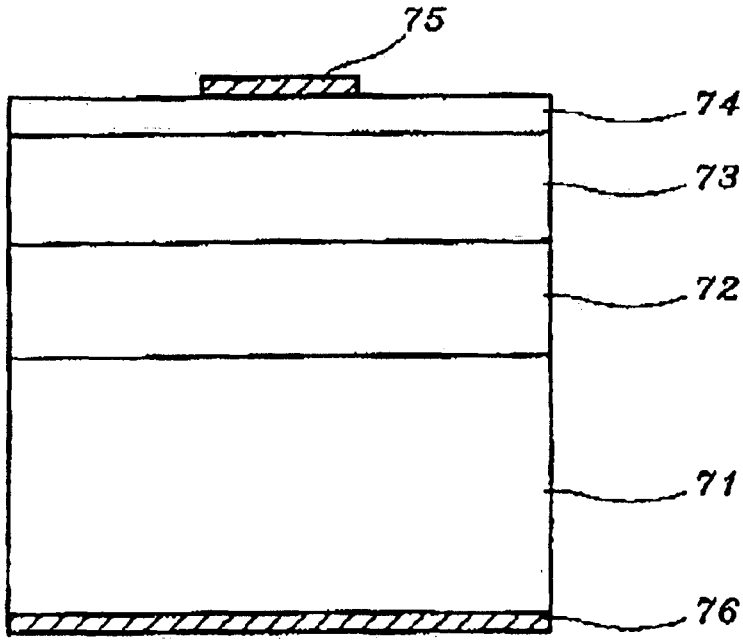
FIG. 8 is a section view of a light emitting device in accordance with a third embodiment of the invention.

Although, there was described in embodiment 2, a light emitting device which was constituted of GaInNAs active layer and had a double heterostructure, a light emitting device comprising also a GaInNAs active layer and having the homo-junction or single heterostructure, may also be fabricated. FIG. 8 represents a sectional view of a light emitting device having a homo-junction structure of embodiment 3.

The light emitting device comprises, an n-GaInNAs layer 72, a p-GaInNAs layer 73, and a p-GaAs contact layer 74, disposed by MOCVD method on an n-GaAs substrate 71 in the order stated. Additionally provided for the device were a positive electrode 75 on the p-GaAs contact layer 74 and a negative electrode 76 on the rear side of the n-GaAs substrate 71.

The present GaInNAs layer was grown so as to be lattice-matched to the GaAs lattice under the same conditions as those adopted in embodiment 1. Also in the present growth, an $AsH_3$ partial pressure was 50 Pa which was higher than that for the conventional growth. This resulted in a GaInNAs active layer with fewer group V vacancies than those in conventionally grown layers and with a higher photoluminescence efficiency.

The control of conductive properties and charge concentration was typically carried out by using dopants such as selenium for n-type, and zinc for p-type. Referring to FIG. 8, for example, selenium was used as an n-type dopant for the n-GaInNAs layer 72, and zinc was used as a p-type dopant for the p-GaInNAs layer 73. As source materials of these dopants, hydrogen selenide for selenium, and dimethylzinc (DMZn) or diethylzinc (DEZn) for zinc were used. Doping efficiencies for these dopants were found satisfactory.

It is generally known that an GaInNAs active layer for DH laser is undoped and, therefore, control of dopants is not necessary. (An exception may be cited here, for the DH LED application, an GaInNAs active layer is often doped, thereby necessitating dopant control.) However, for LEDs having a homo-junction structure such as described in this embodiment, control of, carrier concentrations and a conductive type has to be made, thereby necessitating control of both n-type and p-type dopants. In the present embodiment, selenium and zinc were used for the n-type and p-type dopant, respectively.

It may also be possible to add dopants into a GaInNAs active layer of a DH laser, such as selenium or zinc, for example. This results in a decrease in threshold current for the light emission, since a carrier concentration in the active layer increases, a width of a depletion layer decreases, and a recombination current decreases.

In addition, a bandgap energy of GaInNAs layers is smaller than that of GaAs, as aforementioned. Because of the smaller bandgap energy, the resultant emission from the GaInNAs layers is transparent for GaAs substrates and GaAs contact layers. Therefore, light emitting devices such as described in the above embodiments 1 and 2 may preferably be used as vertical cavity surface emitting lasers (VCSELs) and surface emitting LEDs.

In addition to above-mentioned selenium and zinc, dopants such as beryllium, magnesium, carbon, silicon, germanium, tin, sulfur, or tellurium may also be used. However, since silicon, carbon, germanium and tin are amphoteric, these dopants have the possibility of occupying either group-III or group-V site to complete the charge compensation. Since neither selenium (group VI) nor zinc (group II) is amphoteric, the above-mentioned difficulty can be obviated. Therefore, it is preferred to use group VI dopants such as selenium for n-type and group II dopants such as zinc for p-type, for example.

In addition, a p-n junction can be formed by diffusing appropriate dopants. Furthermore, although the GaInNAs layer was described as an active layer, GaInNAs layers comprised of both of, or either of aluminum or phosphorus may also be used as long as nitrogen and arsenic are simultaneously included in the alloy.

As described above, nitrogen-containing III-V alloy semiconductors can be grown without increasing concentrations of arsenic vacancies, thereby leading to the fabrication of epitaxial wafers and light emitting devices with noble features, using the wafers. For example, there can be preferably fabricated light emitting devices with better temperature characteristics than that of GaInPAs which has conventionally been used in the long wavelength region, and also have a high light power output.

In addition, the uses of the present nitrogen-containing III-V alloy semiconductors are not limited to the above-mentioned light emitting devices, and photodetecting devices such as, for example, photodiodes of excellent characteristics also may preferably be fabricated.

Additional modifications and variations of the present invention are possible in light of the above teachings. It is therefore to be understood that within the scope of the appended claims, the invention may be practiced otherwise than as specifically described herein.

What is claimed as new and desired to be secured by Letters Patent if the United States is:

[1. A method for growing at least one layer of III-V alloy semiconductor on a semiconductor substrate, and including at least nitrogen and arsenic simultaneously, comprising forming said alloy semiconductor by a conventional low pressure MOCVD method, using a nitrogen containing organic compound as a source material for nitrogen and $AsH_3$ for arsenic, wherein said III-V alloy semiconductor comprises GaInNAs.]

[2. The method according to claim 1, wherein said semiconductors substrate comprises GaAs.]

[3. The method according id claim 1, wherein said nitrogen containing organic compound is selected from the group consisting of dimethylhydrazine and tertiary butyl amine.]

[4. The method according to claim 1, further comprising controlling conductive properties of, and carrier concentrations in said alloy semiconductor by adding a dopant, wherein said dopant is selected from the group consisting of beryllium, magnesium, zinc, carbon, silicon, germanium, tin, sulfur, tellurium, and selenium.]

[5. A method for growing at least one layer of III-V alloy semiconductor on a GaAs substrate, and including at least nitrogen and arsenic simultaneously, comprising forming said alloy semiconductor by a conventional low pressure MOCVD method under specified conditions of temperatures and pressures, using a nitrogen containing organic compound as a source material for nitrogen and $AsH_3$ for arsenic, wherein said III-V alloy semiconductor comprises GaInNAs.]

[6. The method according to claim 5, wherein said specified conditions are a partial pressure of said $AsH_3$ in a reactor of equal to or more than 2 Pa and a temperature of said semiconductor substrate of equal to or more than 550° C.]

[7. The method according to claim 5, wherein said specified conditions are a partial pressure of said $AsH_3$ in a reactor of equal to or more than 10 Pa and a temperature of said semiconductor substrate of equal to or more than 600° C.]

[8. The method according to claim 5, wherein said nitrogen containing organic compound is selected from the group consisting of dimethylhydrazine and tertiary butyl amine.]

[9. The method according to claim 5, further comprising controlling conductive properties of, and carrier concentrations in said alloy semiconductor by adding a dopant, wherein said dopant is selected from the group consisting of beryllium, magnesium, zinc, carbon, silicon, germanium, tin, sulfur, tellurium, and selenium.]

[10. A method for growing at least one layer of III-V alloy semiconductor on a GaAs substrate, and including at least nitrogen and arsenic simultaneously, comprising:

forming said alloy semiconductor by a conventional low pressure MOCVD method, using a nitrogen containing organic compound as a source material for nitrogen and $AsH_3$ for arsenic, under conditions such as a partial pressure of said $AsH_3$ in a reactor of equal to or more than 2 Pa and a temperature of said semiconductor substrate of equal to or more than 550° C., wherein said III-V alloy semiconductor comprises GaInNAs.]

[11. The method according to claim 10, wherein said nitrogen containing organic compound is selected from the group consisting of dimethylhydrazine and tertiary butyl amine.]

[12. The method according to claim 10, further comprising:

controlling conductive properties of, and carrier concentrations in said alloy semiconductor by adding a dopant, wherein said dopant is selected from the group consisting of selenium, zinc, and magnesium.]

[13. A method for growing at least one layer of III-V alloy semiconductor on a GaAs substrate, and including at least nitrogen and arsenic simultaneously, comprising:

forming said alloy semiconductor by a conventional low pressure MOCVD method using a nitrogen containing organic compound as a source material for nitrogen and $AsH_3$ for arsenic, under conditions such as a partial pressure of said $AsH_3$ in a reactor of equal to or more than 10 Pa and a temperature of said semiconductor substrate of equal to or more than 600° C., wherein said III-V alloy semiconductor comprises GaInNAs.]

[14. The method according to claim 13, wherein said nitrogen containing organic compound as said source material for nitrogen is selected from the group consisting of dimethylhydrazine and tertiary butyl amine.]

[15. The method according to claim 13, further comprising:

controlling conductive properties of, and carrier concentrations in said alloy semiconductor by adding a dopant, wherein said dopant is selected from the group consisting of beryllium, magnesium, zinc, carbon, silicon, germanium, tin, sulfur, tellurium, and selenium.]

[16. A method for fabricating a semiconductor device, having at least one layer of a III-V alloy semiconductor on a GaAs substrate, comprised of a plurality of group V elements including at least nitrogen and arsenic simultaneously, comprising:

forming said alloy semiconductor by a conventional low pressure MOCVD method, using a nitrogen containing organic compounds as a source material for nitrogen and $AsH_3$ for arsenic, under conditions such as a partial pressure of said $AsH_3$ in a reactor of equal to or more than 2 Pa and a temperature of said semiconductor substrate of equal to or more than 550° C., wherein said III-V alloy semiconductor comprises GaInNAs.]

[17. The method according to claim 16, wherein said nitrogen containing organic compound is selected from the group consisting of dimethylhydrazine and tertiary butyl amine.]

[18. The method according to claim 16, further comprising:

controlling conductive properties of, and carrier concentrations in said semiconductors by adding a dopant, wherein said dopant is selected from the group consisting of beryllium, magnesium, zinc, carbon, silicon, germanium, tin, sulfur, tellurium, and selenium.]

[19. A method for fabricating a semiconductor device, having at least one layer of a III-V alloy semiconductor on a GaAs substrate, comprised of a plurality of group V elements including at least nitrogen and arsenic simultaneously, comprising:

forming said alloy semiconductor by a conventional low pressure MOCVD method using a nitrogen containing organic compound as a source material for nitrogen and $AsH_3$ for arsenic, under conditions such as a partial pressure of said $AsH_3$ in a reactor of equal to or more than 10 Pa and a temperature of said semiconductor substrate of equal to or more than 600° C.]

[20. The method according to claim 19, wherein said nitrogen containing organic compound is selected from the group consisting of dimethylhydrazine and tertiary butyl amine.]

[21. The method according to claim 19, further comprising:

controlling conductive properties of, and carrier concentrations in said alloy semiconductor by adding a dopant, wherein said dopant is selected from the group consisting of beryllium, magnesium, zinc, carbon, silicon, germanium, tin, sulfur, tellurium, and selenium.]

*22. A method for growing at least one layer of III-V alloy semiconductor on a semiconductor substrate, and including at least nitrogen and arsenic simultaneously, comprising: forming said alloy semiconductor by an MOCVD method at a pressure of at least that of conventional low pressure MOCVD, using a nitrogen containing organic compound as a source material for nitrogen, wherein said nitrogen containing organic compound is selected from the group consisting of monomethylhydrazine, dimethylhydrazine and tertiary butyl amine, and using a source material for arsenic, wherein said III-V alloy semiconductor comprises at least Ga, In, N, and As.*

*23. The method according to claim 22, comprising the use of a horizontal type MOCVD apparatus to carry out said MOCVD method.*

*24. The method according to claim 22, wherein said semiconductors substrate comprises GaAs.*

*25. The method according to claim 22, wherein said nitrogen containing organic compound is selected from the group consisting of dimethylhydrazine and tertiary butyl amine.*

*26. The method according to claim 22, further comprising controlling conductive properties of, and carrier concentrations in said alloy semiconductor by adding a dopant, wherein said dopant is selected from the group consisting of beryllium, magnesium, zinc, carbon, silicon, germanium, tin, sulfur, tellurium, and selenium.*

*27. A method for growing at least one layer of III-V alloy semiconductor on a semiconductor substrate, and including at least nitrogen and arsenic simultaneously, comprising:*

*forming said alloy semiconductor by a conventional low pressure MOCVD method under specified conditions of at least one of temperatures and pressures;*

*using a nitrogen containing organic compound as a source material for nitrogen; and*

*using a source material for arsenic,*

*wherein said nitrogen containing organic compound is selected from the group consisting of monomethylhydrazine, dimethylhydrazine and tertiary butyl amine, and*

*wherein a horizontal type MOCVD apparatus is used to carry out said MOCVD method.*

*28. The method according to claim 27, wherein the specified conditions comprise forming said alloy semiconductor at a pressure of at least that of conventional low pressure MOCVD.*

*29. The method according to claim 27, wherein said semiconductors substrate comprises GaAs.*

*30. The method according to claim 27, wherein said nitrogen containing organic compound is selected from the group consisting of dimethylhydrazine and tertiary butyl amine.*

*31. The method according to claim 27, further comprising controlling conductive properties of, and carrier concentrations in said alloy semiconductor by adding a dopant, wherein said dopant is selected from the group consisting of beryllium, magnesium, zinc, carbon, silicon, germanium, tin, sulfur, tellurium, and selenium.*

* * * * *